(12) United States Patent
Adams et al.

(10) Patent No.: US 8,685,599 B1
(45) Date of Patent: Apr. 1, 2014

(54) METHOD OF INTRINSIC MARKING

(75) Inventors: David P. Adams, Albuquerque, NM (US); Joel Patrick McDonald, Midland, MI (US); Bradley Howell Jared, Albuquerque, NM (US); V. Carter Hodges, Albuquerque, NM (US); Deidre Hirschfeld, Socorro, NM (US); Dianna S. Blair, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 142 days.

(21) Appl. No.: 13/403,117

(22) Filed: Feb. 23, 2012

Related U.S. Application Data

(60) Provisional application No. 61/446,270, filed on Feb. 24, 2011.

(51) Int. Cl.
*G03F 1/00* (2012.01)
*G03C 3/00* (2006.01)
*H01S 3/10* (2006.01)
*H01S 3/13* (2006.01)

(52) U.S. Cl.
USPC .......... 430/7; 430/9; 430/945; 430/947; 372/9; 372/24; 372/25; 372/29.014

(58) Field of Classification Search
USPC .......... 430/7, 945, 947, 952, 950, 269, 322; 372/9, 24, 25, 28, 29.014
See application file for complete search history.

(56) References Cited

U.S. PATENT DOCUMENTS

| | | | | |
|---|---|---|---|---|
| 4,504,007 A * | 3/1985 | Anderson et al. | .......... | 228/123.1 |
| 4,769,310 A * | 9/1988 | Gugger et al. | ............ | 430/346 |
| 5,543,269 A * | 8/1996 | Chatterjee et al. | .......... | 430/346 |
| 6,169,266 B1 * | 1/2001 | Hughes | .......... | 219/121.68 |
| 6,411,323 B1 * | 6/2002 | Waarts et al. | ............ | 347/241 |
| 6,497,985 B2 | 12/2002 | McCay et al. | | |
| 6,503,310 B1 * | 1/2003 | Sullivan | ............ | 106/31.6 |
| 6,514,621 B1 * | 2/2003 | Marietti et al. | ............ | 428/432 |
| 6,613,161 B2 * | 9/2003 | Zheng et al. | ............ | 148/241 |
| 6,776,340 B2 * | 8/2004 | Murokh et al. | ............ | 235/454 |
| 6,829,000 B2 * | 12/2004 | Assa et al. | ............ | 347/257 |
| 6,855,910 B2 * | 2/2005 | Harrison | .......... | 219/121.85 |
| 7,723,642 B2 * | 5/2010 | Gu et al. | .......... | 219/121.68 |
| 7,763,179 B2 * | 7/2010 | Levy et al. | ............ | 216/94 |
| 8,379,679 B2 * | 2/2013 | Zhang et al. | ............ | 372/25 |
| 2009/0248124 A1 * | 10/2009 | Pianca et al. | ............ | 607/116 |
| 2011/0315030 A1 * | 12/2011 | Lin | ............ | 101/170 |
| 2012/0213943 A1 * | 8/2012 | Sarver et al. | ............ | 427/555 |

OTHER PUBLICATIONS

M. Birnbaum, Semiconductor Surface Damage Produced by Ruby Lasers, Journal of Applied Physics, vol. 36 (1965), pp. 3688-3689.
E. Gyorgy et al., Structure Formation on Titanium during Oxidation Induced by Cumulative Pulsed Nd:YAG Laser Irradiation, Applied Physics A, vol. 78 (2004), pp. 765-770.
E. Gyorgy et al., Surface Structuring of Titanium under Pulsed Nd:YAG Laser Irradiation, SPIE, vol. 5581 (2004), pp. 323-332.
E. Gyorgy et al., Influence of the Ambient Gas in Laser Structuring of the Titanium Surface, Science Direct—Surface & Coatings Technology, vol. 187 (2004), pp. 245-249.

(Continued)

*Primary Examiner* — Amanda C. Walke
(74) *Attorney, Agent, or Firm* — Kevin W. Bieg

(57) ABSTRACT

A method of pulsed laser intrinsic marking can provide a unique identifier to detect tampering or counterfeiting.

20 Claims, 7 Drawing Sheets

(56) References Cited

OTHER PUBLICATIONS

A. Perez Del Mo et al., Coloring of Titanium by Pulsed Laser Processing in Air, Thin Solid Films, vol. 415 (2002), pp. 201-205.

A. Perez Del Pino et al., Coloring of Titanium through Laser Oxidation: Comparative Study with Anodizing, Science Direct—Surface & Coatings Technology, vol. 187 (2004), pp. 106-112.

M. Wautelet et al., Negative Thermal Feedback in Laser-Assisted Ofidation of Thin Zn Films, Applied Physics A, vol. 47 (1988), pp. 313-316.

M. Wautelet, Laser-Assisted Reaction of Metals with Oxygen, Applied Physics A, vol. 50 (1990), pp. 131-139.

M. Wautelet et al., Lasler-Induced Oxidation of Thin Cadmium and Copper Films, Thin Solid Films, Letter, vol. 100 (1983), pp. L9-L11.

M.H. Wong et al., Laser Oxidation of NiTi for Improving Corrosion Resistance in Hands' Solution, Science Direct Materials Letters, vol. 61 (2007), pp. 3391-3394.

B.S. Yilbas et al., A Numerical Solution for Laser Heating of Titanium and Nitrogen Diffusion in Solid, Journal of MaterialsProcessing Technology, vol. 136 (2003), pp. 12-23.

* cited by examiner

METHOD OF INTRINSIC MARKING

CROSS-REFERENCE TO RELATED APPLICATION

This application claims the benefit of U.S. Provisional Application No. 61/446,270, filed Feb. 24, 2011, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to laser-based markings and, in particular, to a method of pulsed laser intrinsic marking that can provide a unique identifier to indicate tampering or counterfeiting.

BACKGROUND OF THE INVENTION

It is well established that laser irradiation can color the exposed surfaces of various materials by forming an oxide or nitride layer (referred to herein as a 'thin film' or 'color layer' or 'color pattern'). See M. Wautelet, *Appl. Phys. A* 50, 131 (1990). Fundamentally, surface colorization of metals and alloys is a thermochemical growth process facilitated by the heat of absorbed laser light. Localized heating, provided by a focused laser beam, can lead to the growth of dielectric phases with the thickness of these thin films related to the dwell time of the laser and the absorption and diffusion of reactive gas (e.g., O, N, other). The color that forms is intimately related to the layer thickness and its refractive index. If illuminated by white light, the color can be the convolution of reflected wavelengths and those that interfere constructively; wavelengths that interfere destructively will be absent.

The majority of previous experimental and theoretical work on laser colorization involves continuous wave (CW) laser exposure. The extensive work by Wautelet and other groups demonstrates the ability to synthesize oxide layers on more than 20 simple metal surfaces. See M. Wautelet, *Appl. Phys. A* 50, 131 (1990); M. Wautelet and R. Andrew, *Philos. Mag. B* 55, 261 (1987); M. Wautelet and L. Baufay, *Thin Solid Films* 100, L9 (1983); M. Wautelet et al., *App. Phys. A* 47, 313 (1988); M. H. Wong et al., *Materials Letters* 61, 3391 (2007); and I. Ursu et al., *J. Mod. Opt.* 34, 1121 (1987). Chemical kinetic models have been developed to explain the rates of color layer growth during CW irradiation of elemental metals and the dynamical effects of a changing optical absorption coefficient as thickness increases. Studies have also correlated optical properties (often determined by ellipsometry) with thickness and structure. See A. Pérez del Pino et al., *Surf. & Coatings Tech.* 187, 106 (2004); and A. Pérez del Pino et al., Appl. Phys. A 78, 765 (2004).

Recently, several groups have investigated how pulsed laser light interacts with metal surfaces. See E. György et al., *Appl. Phys. A* 78, 765 (2004); M. H. Wong et al., *Mater. Lett.* 61, 3391 (2007); L. Lavisse et al., *Laser in Eng.* 13, 127 (2003); B. S. Yilbas et al., *J. Mat. Proc. Tech.* 136, 12 (2003); E. György et al., *Surf. & Coatings Tech.* 187, 245 (2004); E. György et al., *Proc. SPIE* 5581, 323 (2003); E. György et al., *Appl. Phys. A* 78, 765 (2004); and A. Pérez del Pino et al., *Thin Solid Films* 415, 201 (2002). Generally, this process involves sequential irradiation of a metal surface (or evolving color layer) with a train of light pulses. Models and experiments have focused on predicting the thickness of color layers by accounting for the repetitive rise in temperature, the cooling rates (after the arrival of a pulse) and the gas diffusion coefficient into an irradiated target material. See B. S. Yilbas et al., *J. Mat. Proc. Tech.* 136, 12 (2003).

Surface roughness is an additional feature that can develop during laser irradiation. A scanned-laser process can produce a periodic surface roughness due to the point-to-point variations in laser fluence incident on a surface. The variation in fluence across a surface can lead to surface roughening, because material removal (by ablation, evaporation or sublimation) occurs at sites where fluence is large compared with neighboring low fluence areas. For CW laser and pulsed laser processes, a rough final surface can arise from the spacing (hatch) between subsequent lines commanded by the operator. By choosing a hatch that is significantly less than the width of the laser beam, one generally establishes a uniform fluence across an area. By choosing a hatch that is significantly larger than the width of the laser beam, one establishes a non-uniform fluence. For pulsed laser irradiation, the arrival of individual pulses can further lead to roughening. Depending on the relative rates of pulse arrival and scan velocity, a variety of surface morphologies can develop.

Previous work has shown that ultra-fast lasers (having pulse durations of approximately <1 picosecond) can induce periodic surface structures. The periodicity can be on the order of or less than the laser wavelength. The open literature points to ablation as a pathway for roughening although a number of fundamental interactions have been proposed. Since the original report by Birnbaum, laser-induced periodic structures have been researched for their regular spacing and ubiquitous nature—forming in several monolithic solids including semiconductors and dielectrics. See M. Birnbaum, *J. Appl. Phys.* 36, 3688 (1965). The polarization of the incident laser light may give rise to periodic surface roughness in some processes.

SUMMARY OF THE INVENTION

The present invention is directed to a method of intrinsic marking comprising irradiating the surface of a substrate with at least one laser pulse to provide a color pattern and/or laser-induced periodic surface structure on the substrate through reaction with a background gas. The substrate can be compositionally inhomogeneous or it can be compositionally homogeneous. For example, a compositionally-inhomogeneous substrate can comprise a metal-ceramic composite, a metal-polymer substrate or a dual-phase steel. The substrate can also comprise joined dissimilar materials that are welded, brazed or soldered. For laser coloring and laser-induced roughening, the duration of the at least one laser pulse can be less than 200 nanoseconds. One of a variety of wavelengths can be chosen to interact with a specific substrate material. The at least one laser pulse can comprise a plurality of repeated laser pulses with a repetition rate of less than 500 kHz.

Intrinsic microscopic features can form due to the interaction of laser light with the compositional, structural or topographical inhomogenieties present on an initial or evolving substrate surface. For example, isolated microscopic features comprising a different color with respect to its immediate surroundings can be formed on the surface. In another embodiment, surface roughening can occur at specific sites. This can occur within a macroscale, laser-defined color pattern. Isolated features having a unique signature in the form of a periodic roughness can develop in areas that are treated with a uniform laser fluence. Formation of intrinsic microscopic features can be of great use as unique identifiers, because of their random size, location and spacing.

The present invention provides versatile laser marking techniques. Owing to the expected complexity of features (spanning a range of length scales and their formation at preferred surface sites), markings made by pulsed lasers can be considered virtually impossible to replicate and counterfeit.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Short and ultra-short laser pulses can interact with the surfaces of various materials to create complex 'fingerprints' for potential use as passive indicators of tamper, and therefore possible interference with equipment. In particular, short and ultra-short pulsed lasers can be used to create unique markings in the form of color layers and surfaces having periodic surface structures or both. These patterns or markings can be documented and archived for comparison at a future date.

When laser light is applied to a material surface that has a compositional, structural, or topographical inhomogeneity, a complex arrangement of microscopic features can result. Isolated or connected microscopic features can comprise an entire laser-defined color pattern or a subset of this. For added assurance as a passive tamper indicator, periodic, micro- or nanometer—scale surface topography or other surface features can develop. In particular, laser-induced periodic surface structures can form at select sites on a surface. This can occur for the same laser parameters used to define color features or it may require a second laser process step. If the final appearance of a marking is influenced by the size or randomness of structure initially present on a surface (whether on a vessel, weld, etc.), the laser-created patterns can be virtually impossible to replicate or duplicate. Intrinsic, microscopic features can be contained within a larger pattern such as a color marking.

Color Definition

Figures 1A, 1B:
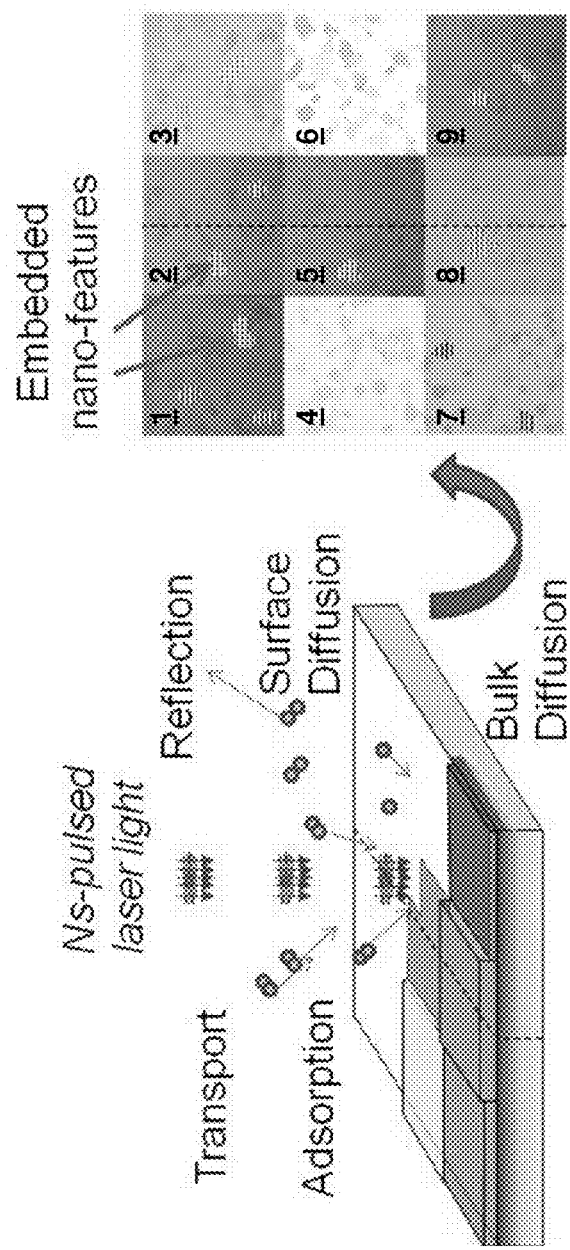
FIG. 1A is a schematic illustration of a pulsed laser apparatus for intrinsic marking that can provide a unique identifier on a substrate to reveal tampering or counterfeiting.
FIG. 1B is a schematic illustration of an array of color patterns formed on a substrate with embedded nano-features.

FIG. 1A is a schematic illustration of a pulsed laser apparatus for intrinsic marking that can provide a unique identifier on a substrate to reveal tampering or counterfeiting. A method of the present invention comprises irradiating the surface of a substrate with at least one laser pulse to provide a color layer on the substrate through reaction with a background gas. The surface can be planar or non-planar. Short and ultra-short pulses of light can interact with the surfaces of materials to create color 'fingerprints'. Pulsed-laser colorization is a complex growth process affected by gas transport, adsorption, absorption, surface diffusion, bulk diffusion and exothermic reactions. Essential to laser irradiation of a surface is some degree of material heating and associated temperature increase in the vicinity of exposure. The heat stimulates reaction with a surrounding gas.

A pattern of colors or a pattern of a single color can be commanded using a scanned laser approach. This can involve the control of scan speed and average power to affix fluence. By varying the fluence across the surface an array of different color patterns can be formed on a substrate according to a pre-determined lookup table (once developed) or at random if pre-determined values are not assigned. For example, pulse durations of 200 nanosecond (ns) or less can be used and the pulse repetition rate can be varied to generate different color layers on substrates when using a scanned laser approach. For example, an Er-doped glass-fiber laser with pulse durations between 9 and 200 ns and a variable repetition rate from 5-500 kHz can be utilized, although other pulsed lasers can also be used. Alternatively, the fluence variations required to define a color pattern can be generated using a flood exposure of intense laser light. This flood exposure is put through an attenuation mask that varies the fluence on different areas of a surface.

Complex color layer patterns include single color markings or those with more than one color. The pattern can include unmarked areas for contrast. Black-white patterns are possible. The patterns can further comprise embedded micro- or nano-features that have a color different than their immediate surroundings. Color markings comprise encrypted tags. This includes two-dimensional patterns or line barcodes. The encrypted tags can be constructed with a single color or the color can be varied within a tag for the purpose of including additional information.

Figure 2:
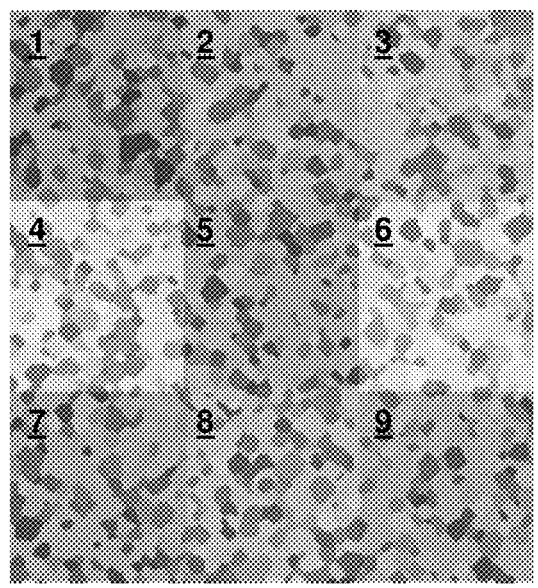
FIG. 2 is a schematic illustration of an array of color patterns (in plan view).
Figure 3:
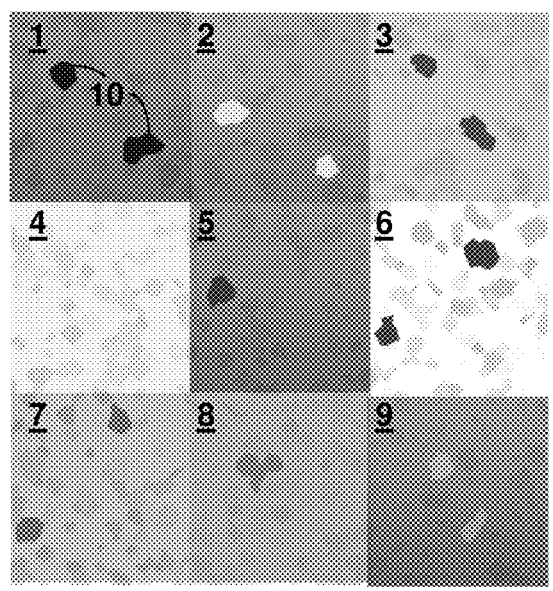
FIG. 3 is a schematic illustration of markings produced by pulsed laser irradiation (in plan view) wherein isolated, microscopic features with locally-different colors are formed within a larger color pattern.
Figure 4:
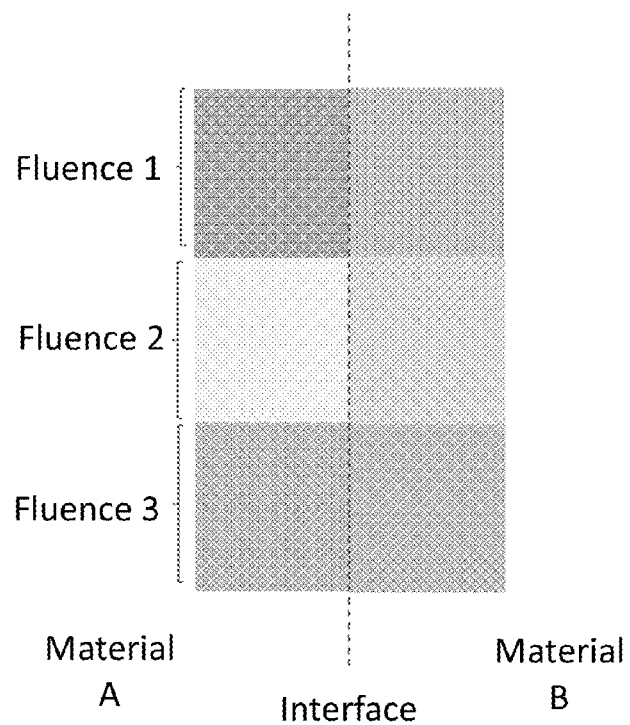
FIG. 4 is a schematic illustration of color patterns formed across an interface of two joined materials (in plan view).
Figure 5:
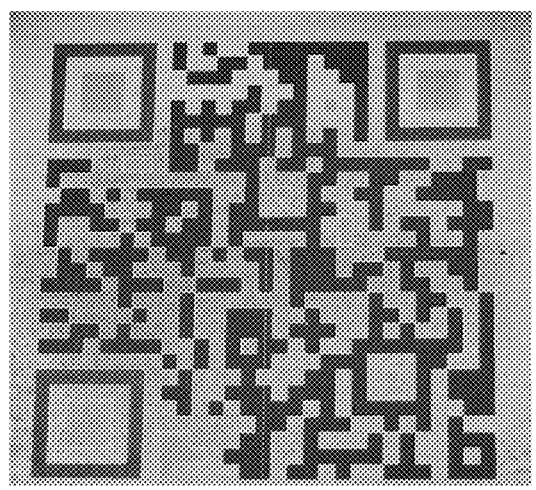
FIG. 5 is a schematic illustration of an encrypted color pattern formed in a surface (in plan view).

The substrate can be compositionally homogeneous and comprise two or more elements. For example, FIG. 2 shows an array of patterns 1 to 9 produced by pulsed laser irradiation (in plan view) wherein isolated, microscopic features with locally-different colors form within a larger color pattern. Alternatively, the substrate can be compositionally inhomogeneous. For example, the compositionally inhomogeneous substrate can comprise a metal-ceramic composite or a metal-polymer composite. Other substrates include, but are not limited to, titanium alloys, aluminum alloys, nickel-cobalt ferrous alloys, solder, braze alloys, and silicon. FIG. 3 shows an array of patterns, wherein each pattern has one or more intrinsic, embedded microscopic features 10 within a color pattern 1 that have a color different than their immediate surroundings. A color pattern can be created across an interface of joined materials having similar or identical composition, or can be created across an interface of joined dissimilar materials A and B, as shown in FIG. 4. FIG. 5 shows an encrypted two-dimensional pattern of colors on the surface.

The optical properties of color layers can be probed during a laser marking process using one of a variety of well-established methods including reflectance measurements, spectroscopic reflectance measurements, interference methods, or ellipsometry. This permits endpointing of color features or whole patterns. The information provided by these optical techniques can be used to feedback control the pattern definition and assure an accurate marking.

Surface Roughness

To further increase the effectiveness of laser-defined features as a tamper indication technology, micro- or nano-scale topography can be created at surfaces or interfaces.

Where laser pulses of nanosecond and greater pulse duration can generate colors through processes akin to thermal oxidation, these same laser processes can lead to surface roughening. Surface roughness, whether periodic or aperiodic, can be a unique fingerprint.

Alternatively, ultrashort pulses such as femtosecond duration pulses can produce periodic or aperiodic surface roughness. This can arise due to ablation, re-attachment of ablation debris or both. Selective coupling to preferred topographical features (protrusions) or phases exposed at a surface can generate roughness even when utilizing a uniform fluence.

The duration of the laser pulse can be less than 200 nanoseconds. Preferably, the duration of the laser pulse is less than 1 picosecond. The periodic surface roughness can be generated using the same laser used for creating color features. Alternatively, the periodic surface roughness is generated using a different laser than that used for creating color features.

Surface colorization and surface roughness can be combined into a single pattern. This is motivated by the desire for complex features that are difficult to replicate and duplicate. With pulse durations of order nanoseconds (where both roughening and colorization are known to occur independently), color and surface roughness can form simultaneously. This can be advantageous as a marking technique because it is a single step process and can involve a single laser.

Figure 6:
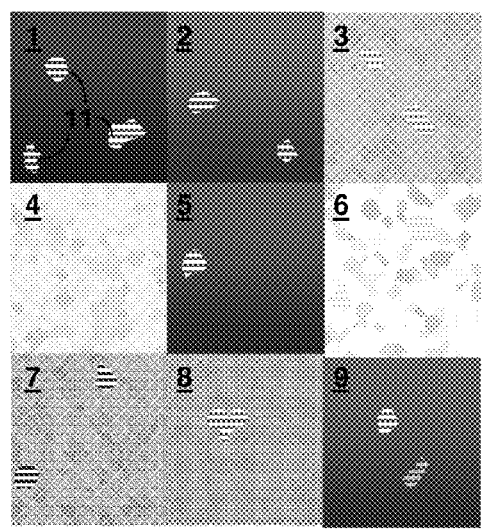
FIG. 6 is a schematic illustration of a color layer pattern (in plan view) with periodic surface roughness generated at discrete microscopic sites that comprise a subset of the color pattern.
Figure 7:
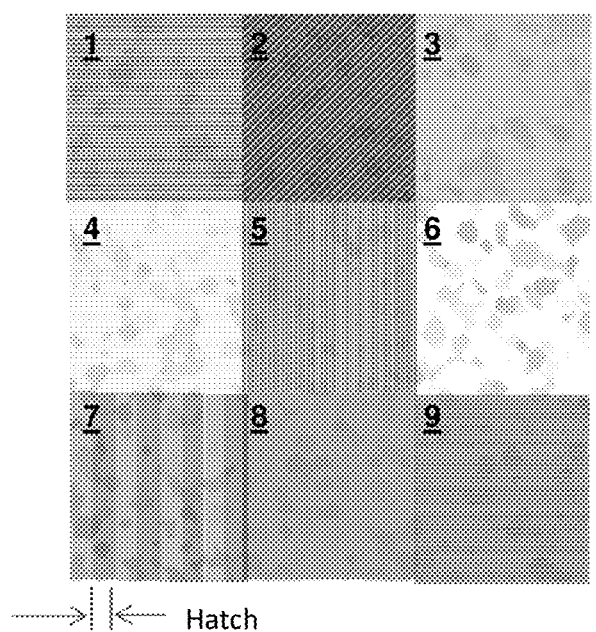
FIG. 7 is a schematic illustration of a color layer pattern (in plan view), with surface roughness having a periodicity approximately equal to the hatch. Different spacings and orientations are shown.

The periodic surface roughness can be generated within a color feature or pattern. As shown in FIG. 6, periodic surface roughness can be generated at discrete microscopic sites 11 within a color pattern 1 that comprise a subset of a color feature or pattern. The periodicity of the roughness can be approximately equal to or less than the wavelength of the laser light. As shown in FIG. 7, the periodicity of the roughness can be approximately equal to the hatch, or spacing, between scanned laser lines used to create a feature or color pattern. The orientation of the hatch depends on the scan direction.

Subsurface Magnetic Signatures

The definition of a color layer using an assist gas generally involves the reaction of metal within a portion of the substrate. Metal can diffuse into the color layer and form a metal oxide, for example. As a result one or more species in the original substrate can be denuded to a significant depth. As a result the magnetic structure of a solid can be impacted. The change in near-interface magnetic structure can be a consequence of forming laser color oxides and can require no additional treatment. For example, work with steels shows that chromium and potentially other species, such as manganese, diffuse into a laser-defined color layer during processing. This can result in an iron-rich structure just below the oxide to several microns depth. As a result, the magnetic domain structure can be modified.

The resultant, changed magnetic structure represents a unique signature that can be used as a fingerprint. This can be probed using several methods, such as magnetic force microscopy. The layout of magnetic structure can be documented and archived for future comparison.

The superposition and registry of sub-surface magnetic domain structure with color patterns and/or surface roughness can be a unique fingerprint for use in offsetting activities such as counterfeiting.

The present invention has been described as a method of intrinsic marking. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method of intrinsic marking, comprising irradiating the surface of a substrate with at least one laser pulse to form at least one color pattern on the surface, wherein the substrate comprises a solder.

2. A method of intrinsic marking, comprising irradiating the surface of a substrate with at least one laser pulse to form at least one color pattern on the surface, wherein the substrate comprises a braze alloy.

3. A method of intrinsic marking, comprising irradiating the surface of a substrate with at least one laser pulse to form at least one color pattern on the surface, wherein the substrate comprises silicon.

4. A method of intrinsic marking, comprising irradiating the surface of a substrate with at least one laser pulse to form at least one color pattern on the surface, further comprising forming one or more intrinsic, microscopic features within at least one of the color patterns having a color different than the color pattern, wherein a constant laser fluence is used within each of the at least one color patterns.

5. A method of intrinsic marking, comprising irradiating the surface of a substrate with at least one laser pulse to form at least one color pattern on the surface, wherein at least two color patterns are formed across an interface of joined materials having similar or identical composition.

6. A method of intrinsic marking, comprising irradiating the surface of a substrate with at least one laser pulse to form at least one color pattern on the surface, wherein at least two color patterns are formed across an interface of joined dissimilar materials.

7. The method of claim 4, wherein the duration of the at least one laser pulse is less than 200 nanoseconds.

8. The method of claim 4, wherein the at least one laser pulse comprises a plurality of repeated laser pulses with a repetition rate of less than 500 kHz.

9. The method of claim 4, wherein the laser comprises an Er-doped fiber laser.

10. A method of intrinsic marking, comprising irradiating the surface of a substrate with at least one laser pulse to form at least one color pattern on the surface, further comprising using a light-based measurement technique to endpoint a desired color in a color pattern by feedback control of the pattern definition.

11. The method of claim 10, wherein the light-based measurement technique comprises a reflectance, spectroscopic reflectance, interference, or ellipsometric method or combination thereof.

12. The method of claim 4, wherein the at least one color pattern comprises an encrypted pattern.

13. A method of intrinsic marking, comprising irradiating the surface of a substrate with at least one laser pulse to form at least one color pattern on the surface, further comprising forming a periodic surface roughness within at least one of the color patterns wherein the periodic surface roughness is formed at a discrete microscopic site within the at least one of the color patterns.

14. The method of claim 13, wherein the periodicity of the surface roughness is approximately equal to or less than the wavelength of the laser light.

15. The method of claim 13, wherein scanned laser lines are used to produce at least one of the color patterns and the periodicity of the surface roughness is approximately equal to a hatch, or spacing, between the scanned laser lines.

16. The method of claim 13, wherein the duration of the at least one laser pulse is less than 200 nanoseconds.

17. The method of claim 13, wherein the periodic surface roughness is formed using the same laser used for forming at least one of the color patterns.

18. A method of intrinsic marking, comprising irradiating the surface of a substrate with at least one laser pulse to form at least one color pattern on the surface and further comprising forming a periodic surface roughness within at least one of the color patterns, wherein the periodic surface roughness is formed using a different laser than that used for forming at least one of the color patterns.

19. The method of claim 13, wherein the duration of the at least one laser pulse is less than 1 picosecond.

20. A method of intrinsic marking, comprising irradiating the surface of a substrate with at least one laser pulse to form at least one color pattern on the surface and further comprising forming an inclusion of sub-surface magnetic domain structure in at least one of the color patterns.

\* \* \* \* \*